(12) United States Patent
Hopkins

(10) Patent No.: US 8,389,383 B1
(45) Date of Patent: Mar. 5, 2013

(54) PATTERNED SEMICONDUCTOR BASES, AND PATTERNING METHODS

(75) Inventor: John D. Hopkins, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 13/080,205

(22) Filed: Apr. 5, 2011

(51) Int. Cl.
 *H01L 21/00* (2006.01)
 *H01L 23/544* (2006.01)

(52) U.S. Cl. ........................................ 438/462; 257/797

(58) Field of Classification Search .................. 438/401, 438/448, 462, 975; 257/797
See application file for complete search history.

(56) References Cited

U.S. PATENT DOCUMENTS

| | | | |
|---|---|---|---|
| 7,396,781 B2 | 7/2008 | Wells | |
| 7,790,360 B2 | 9/2010 | Alapati et al. | |
| 7,807,575 B2 | 10/2010 | Zhou | |
| 7,842,616 B2 | 11/2010 | Ikeda et al. | |
| 2010/0330498 A1 | 12/2010 | Bae et al. | |
| 2011/0129991 A1 | 6/2011 | Armstrong et al. | |

FOREIGN PATENT DOCUMENTS

WO WO 2008/091343 7/2008

*Primary Examiner* — Calvin Lee
(74) *Attorney, Agent, or Firm* — Wells St. John P.S.

(57) ABSTRACT

Some embodiments include patterning methods. First and second masking features may be formed over first and second regions of a semiconductor base, respectively. A protective mask may be formed over the second masking features. First and second spacers may be formed along sidewall edges of the first masking features and along lateral edges of the protective mask, respectively. The protective mask and the first masking features may be removed without removing the second masking features, without removing the first spacers, and without removing the second spacers. The first spacers may be third masking features that are at a tighter pitch than the first masking features. Patterns of the second masking features and the third masking features may be transferred into the semiconductor base. Some embodiments include patterned semiconductor bases.

30 Claims, 16 Drawing Sheets

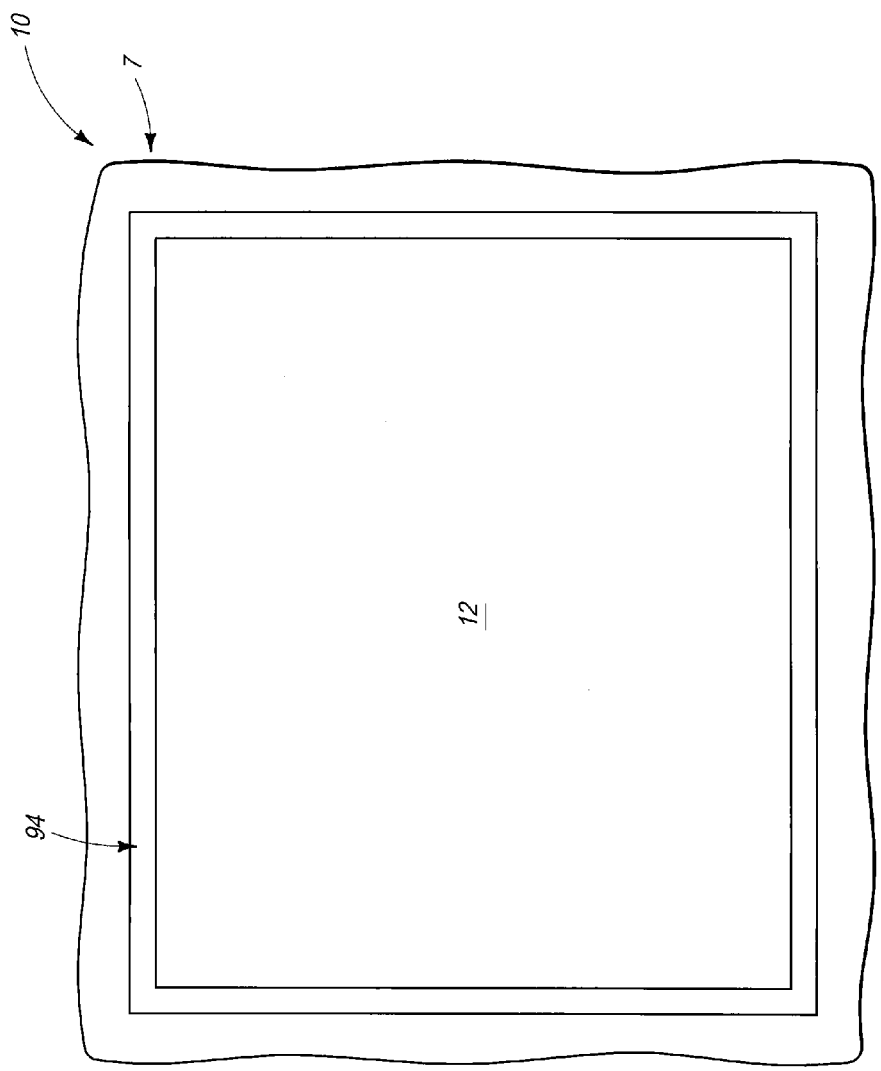

US 8,389,383 B1

PATTERNED SEMICONDUCTOR BASES, AND PATTERNING METHODS

TECHNICAL FIELD

Patterned semiconductor bases, and patterning methods.

BACKGROUND

Photolithography is commonly utilized during integrated circuit fabrication. Photolithography comprises patterning of photoresist by exposing the photoresist to a pattern of actinic energy, and subsequently developing the photoresist. The patterned photoresist may then be used as a mask, and a pattern may be transferred from the photolithographically-patterned photoresist to underlying materials.

A continuing goal in semiconductor processing is to reduce the size of individual electronic components, and to thereby enable smaller and denser integrated circuitry. A concept commonly referred to as "pitch" can be used to quantify the density of an integrated circuit pattern. A photolithographic technique will tend to be constrained by a minimum pitch below which the particular photolithographic technique cannot reliably form features. The minimum pitches associated with photolithographic techniques present obstacles to continued feature size reduction in integrated circuit fabrication.

Pitch multiplication, such as pitch doubling, is one proposed method for extending the capabilities of photolithographic techniques beyond their minimum pitch.

In some applications, it is desired to form different levels of pitch multiplication across different regions of a semiconductor substrate. For instance, it may be desired to perform pitch-doubling along one region of a semiconductor substrate, and to perform pitch-quadrupling along another region of a semiconductor substrate. It can be advantageous to utilize common process steps when forming the different levels of pitch multiplication in that such may improve economy associated with a fabrication process. However, it can be difficult to develop appropriate processing to combine steps of the different levels of pitch multiplication without also introducing other complexities into the fabrication process which offset the gains achieved from the combined steps.

It is desirable to develop new methodologies for pitch multiplication, and to develop processes for applying such methodologies to integrated circuit fabrication. It is further desirable to develop methodologies for pitch multiplication which may efficiently enable multiple common steps to be performed while achieving different levels of pitch multiplication across different regions of a semiconductor substrate.

BRIEF DESCRIPTION OF THE DRAWINGS

FIGS. 10A and 14A are diagrammatic plan views of regions of the semiconductor construction of FIGS. 1-14 at the processing stages of FIGS. 10 and 14, respectively.

DETAILED DESCRIPTION OF THE ILLUSTRATED EMBODIMENTS

Some embodiments include methods which may be utilized to form a first pattern over one region of a semiconductor base and a second pattern over another region of the base, with the first pattern having a tighter pitch than the second pattern. In some embodiments, the first pattern may be suitable for fabricating high-density structures of a memory array (for instance, components of a dynamic random access memory (DRAM) array, components of a NAND array, etc.) and the second pattern may be suitable for fabricating circuitry peripheral to the memory array. The circuitry peripheral to the memory array may include, for example, control circuitry (such as, for example, logic circuitry) that controls access to memory cells of the memory array during read/write operations, and/or may include routing circuitry that electrically connects circuitry of the memory array to the control circuitry.

An example embodiment is described with reference to FIGS. 1-14.

Figure 1:
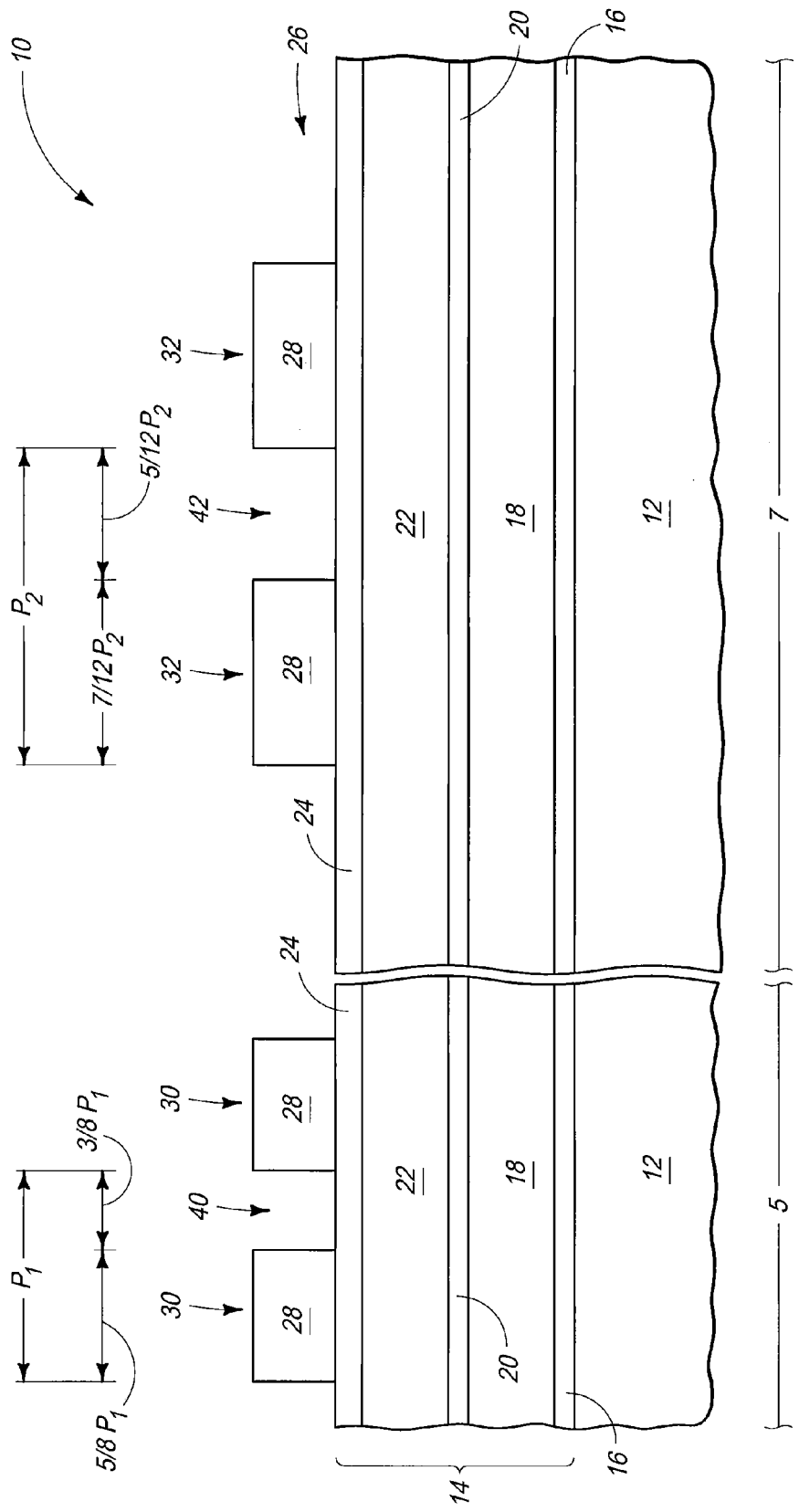
FIGS. 1-14 are diagrammatic cross-sectional views of a semiconductor construction shown at various stages of an example embodiment method for patterning multiple regions of a semiconductor base.

Referring to FIG. 1, a semiconductor construction 10 is shown to comprise a base 12 subdivided into regions 5 and 7. Region 5 corresponds to a portion of the base where a relatively tight-pitch pattern is to be formed, and region 7 corresponds to a portion of the base where a relatively loose-pitch pattern is to be formed. In some embodiments, region 5 may correspond to a portion of the base which will ultimately encompass a memory array (for instance, a DRAM array or a NAND array), and region 7 may correspond to a portion of the base which will ultimately encompass circuitry peripheral to the memory array (for instance, routing circuitry and/or control circuitry). Although only two regions are shown in FIG. 1, the methodology described herein may be utilized to form multiple patterns of different pitches across multiple regions of a base, and accordingly other embodiments (not shown) may have three or more regions of the semiconductor base having three or more different densities of pitches that are to be formed.

The base 12 may comprise, consist essentially of, or consist of monocrystalline silicon, and may be referred to as a semiconductor substrate, or as a portion of a semiconductor substrate. The terms "semiconductor base," "semiconductor substrate," and "semiconductor construction" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

A stack 14 is over the base 12. The stack 14 includes a first material 16, a second material 18, a third material 20, a fourth material 22, and a fifth material 24. In some embodiments, the first material 16 may comprise, consist essentially of or consist of silicon nitride; the second material 18 may comprise, consist essentially of, or consist of carbon; the third material 20 may comprise, consist essentially of, or consist of silicon oxynitride (DARC); the fourth material 22 may comprise, consist essentially of, or consist of carbon; and the fifth material 24 may comprise, consist essentially of, or consist of silicon oxynitride (DARC).

Although materials 20 and 24 may both comprise silicon oxynitride, the ratios of silicon, oxygen and nitrogen may vary in material 24 relative to material 20 so that material 24 may be selectively removed relative to material 20. In some embodiments, material 20 may correspond to a so-called bilayer DARC. For purposes of interpreting this disclosure and the claims that follow, a first material is considered to be "selectively removed" relative to a second material if the first material is removed at a faster rate than the second material; which can include, but is not limited to, embodiments in which the first material is removed under conditions which are 100 percent selective for the first material relative to the second material.

A patterned mask 26 is formed across the first and second regions 5 and 7 of the base 12. The patterned mask comprises a masking material 28. Such masking material may be photolithographically-patterned photoresist in some embodiments.

The patterned mask comprises first masking features 30 over the first region 5 of the base, and comprises second masking features 32 over the second region 7 of the base. The first masking features are formed to a first pitch, $P_1$; and the second masking features are formed to a second pitch, $P_2$. The first pitch is shown to be tighter than the second pitch; and in the shown embodiment $P_1$ is about $2/3$ of $P_2$. The illustrated first masking features 30 are representative of a large number of masking features that would be formed across the region 5 of the semiconductor base at the first pitch, $P_1$; and similarly the illustrated second masking features 32 are representative of a large number of masking features that would be formed across the region 7 of the semiconductor base at the second pitch, $P_2$.

The first masking features are spaced from one another by a gap 40, and the second masking features are separated from one another by a gap 42. In the shown embodiment, the first masking features have widths of about $5/8$ $P_1$, and the second features 32 have widths of about $7/12$ $P_2$. The gap 40 has a width of about $3/8$ $P_1$, and the gap 42 has a width of about $5/12$ $P_2$.

Figure 2:
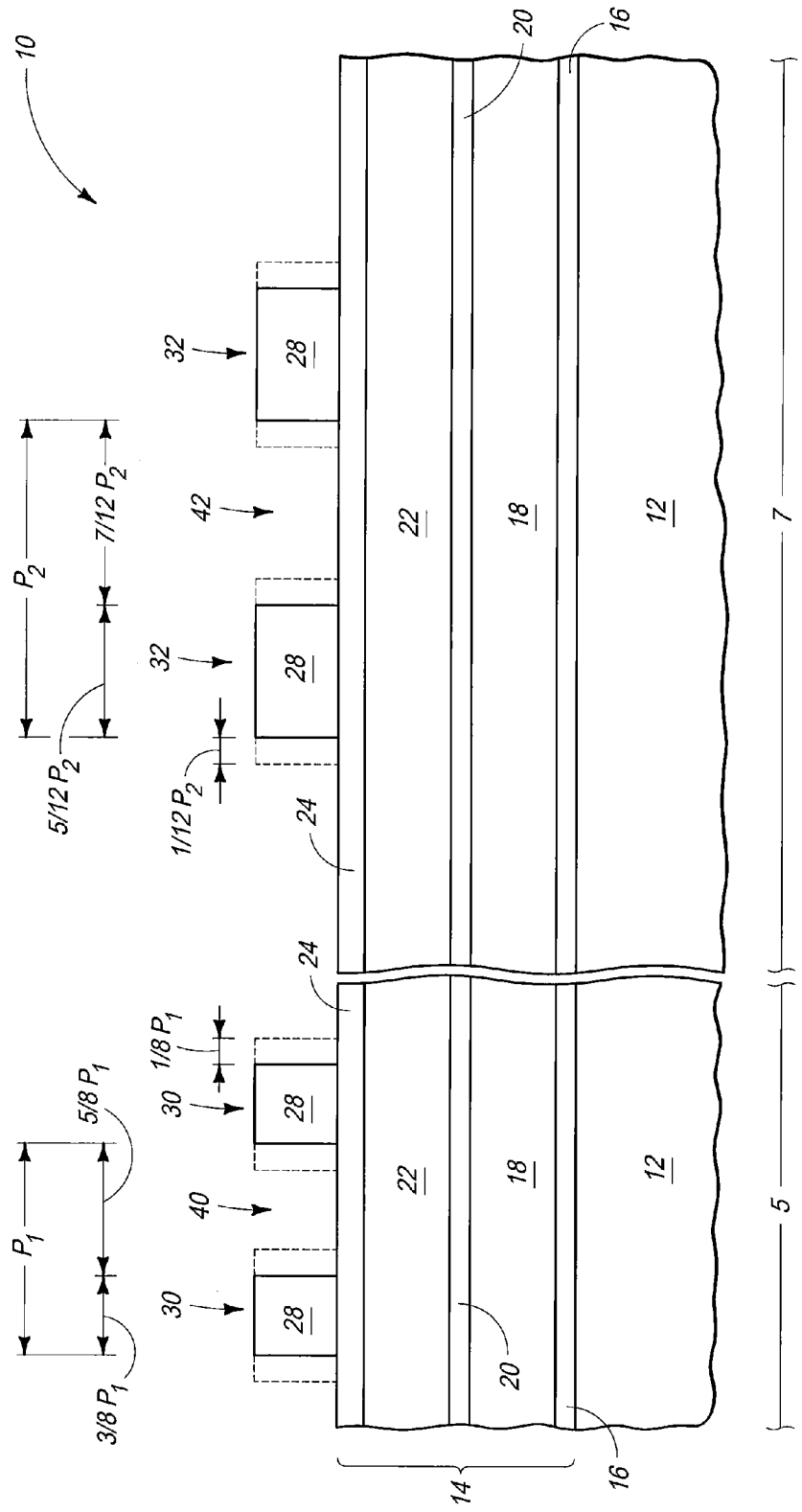

Referring to FIG. 2, the first and second masking features 30 and 32 are subjected to lateral trimming to remove material from the sides of features 30 and 32. In the shown embodiment, about $1/8$ $P_1$ of material 28 is removed from each side of the features 30, and about $1/12$ $P_2$ of material 28 is removed from each side of features 32 (with $1/12$ $P_2$ being equivalent to $1/8$ $P_1$ in the shown embodiment). The original locations of the sides of the features 30 and 32 (i.e., the locations of the sides of such features at the processing stage of FIG. 1) are shown in FIG. 2 in dashed-line view to assist the reader in understanding the dimensional changes that occurred to the features 30 and 32 through the lateral trimming. Although the tops of the features 30 and 32 are shown to be unaffected by the lateral trimming, in some embodiments the lateral trimming conditions may decrease the height of the features and/or may induce other changes to the features (e.g., may impose a dome-shape to the features). For instance, lateral trimming conditions may be chosen which isotropically etch the features 30 and 32.

The lateral trimming of features 30 and 32 may be omitted in some embodiments. If the lateral trimming is utilized, such lateral trimming may be accomplished with any suitable processing; including, for example, plasma etching within an inductively coupled reactor.

The lateral trimming reduces the widths of features 30 from the dimension of about $5/8$ $P_1$ of FIG. 1 to a dimension of about $3/8$ $P_1$; and causes a corresponding increase in the width of gap 40 from the dimension of about $3/8$ $P_1$ of FIG. 1 to a dimension of about $5/8$ $P_1$. Similarly, the lateral trimming reduces the widths of features 32 from the dimension of about $7/12$ $P_2$ of FIG. 1 to a dimension of about $5/12$ $P_2$; and causes a corresponding increase in the width of gap 42 from the dimension of about $5/12$ $P_2$ of FIG. 1 to a dimension of about $7/12$ $P_2$.

Figure 3:
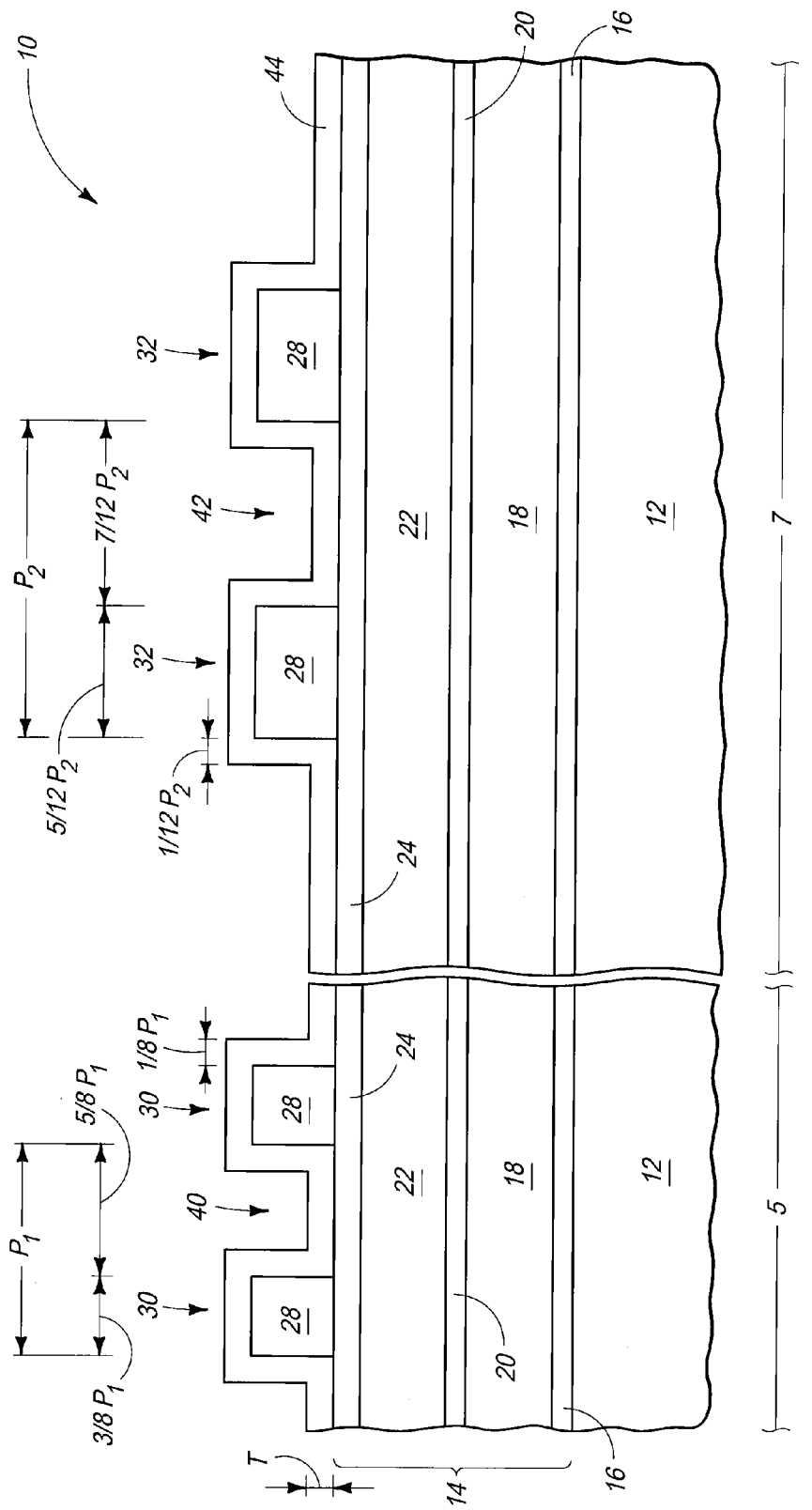

Referring to FIG. 3, spacer material 44 is formed over and between the masking features 30 and 32. The spacer material has a thickness, T, of about $1/8$ $P_1$ (i.e., $1/12$ $P_2$). The spacer material may comprise any suitable composition or combination of compositions, and in some embodiments may comprise, consist essentially of, or consist of silicon dioxide. The spacer material may be formed with any suitable methodology, including, for example, one or both of atomic layer deposition (ALD) and chemical vapor deposition (CVD). In the shown embodiment, the spacer material is formed conformally over and between the features 30 and 32 so that such spacer material maintains a substantially common thickness along horizontal and vertical surfaces.

Figure 4:
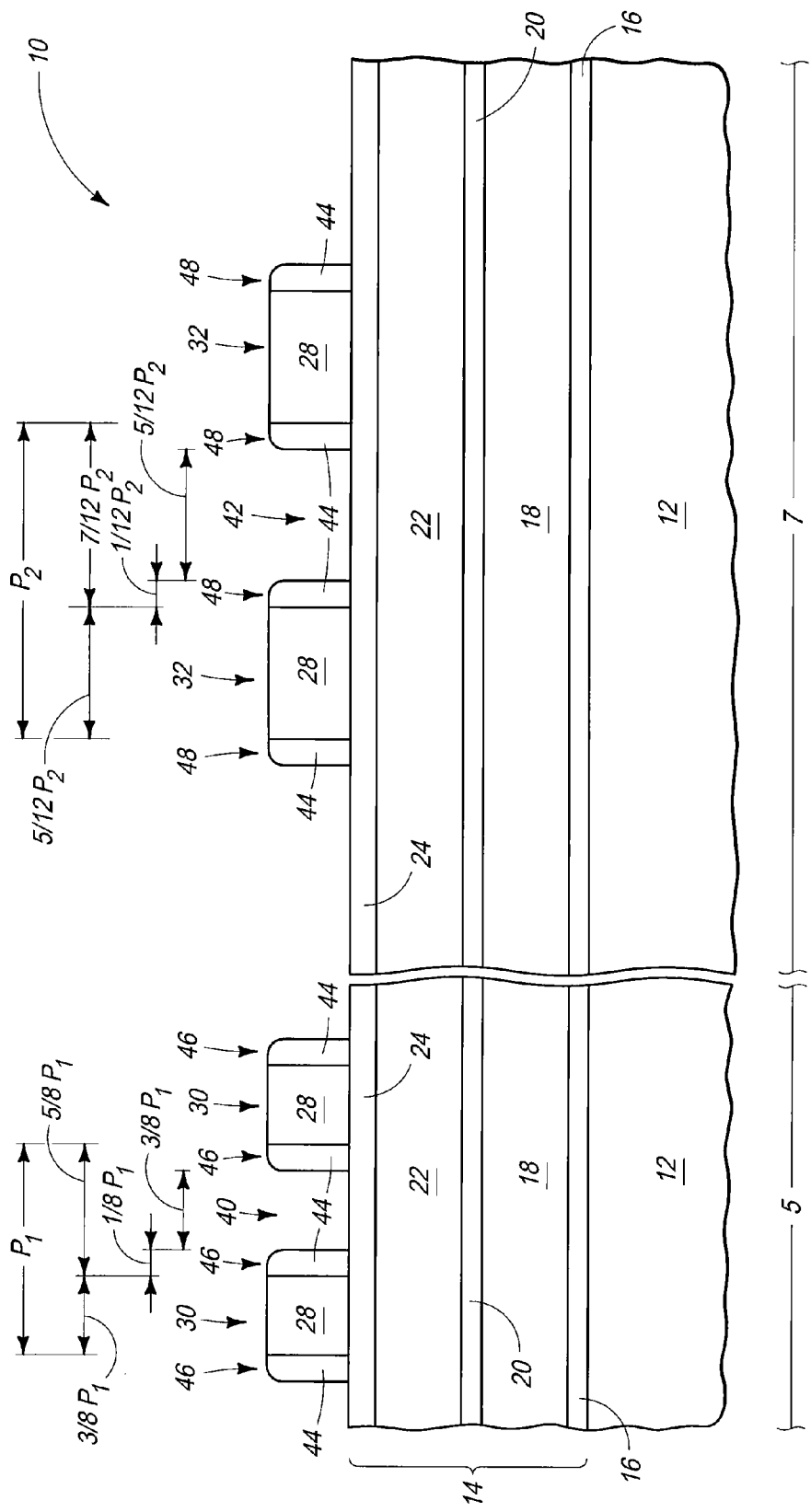

Referring to FIG. 4, spacer material 44 is subjected to an anisotropic etch to form spacers 46 along the sides of the masking features 30, and to form spacers 48 along the sides of the features 32. The spacers 46 and 48 have the same widths as one another, with the spacers 46 being shown to have widths of $1/8$ $P_1$, and with the spacers 48 being shown to have widths of $1/12$ $P_2$.

Figure 5:
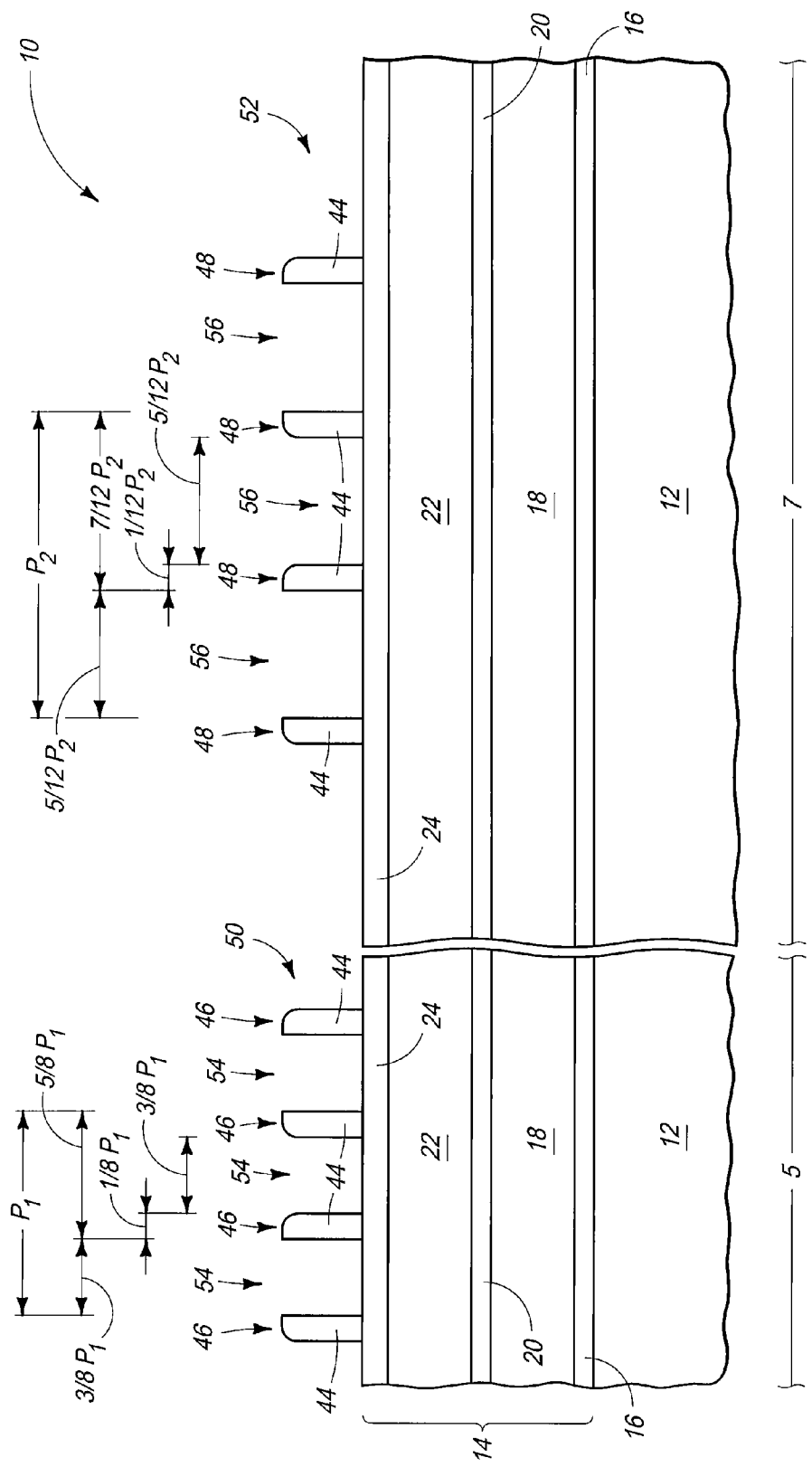

Referring to FIG. 5, masking features 30 and 32 (FIG. 4) are removed to leave a pattern 50 over region 5, and a pattern 52 over region 7. The pattern 50 comprises the spacers 46 spaced-apart from one another by intervening gaps 54, and the pattern 52 comprises the spacers 48 spaced-apart from one another by intervening gaps 56. The gaps 54 have widths of about $3/8$ $P_1$, and the gaps 56 have widths of about $5/12$ $P_2$.

In some embodiments, the patterns 50 and 52 may be considered to have been formed utilizing the first and second masking features 30 and 32 as templates.

Figure 6:
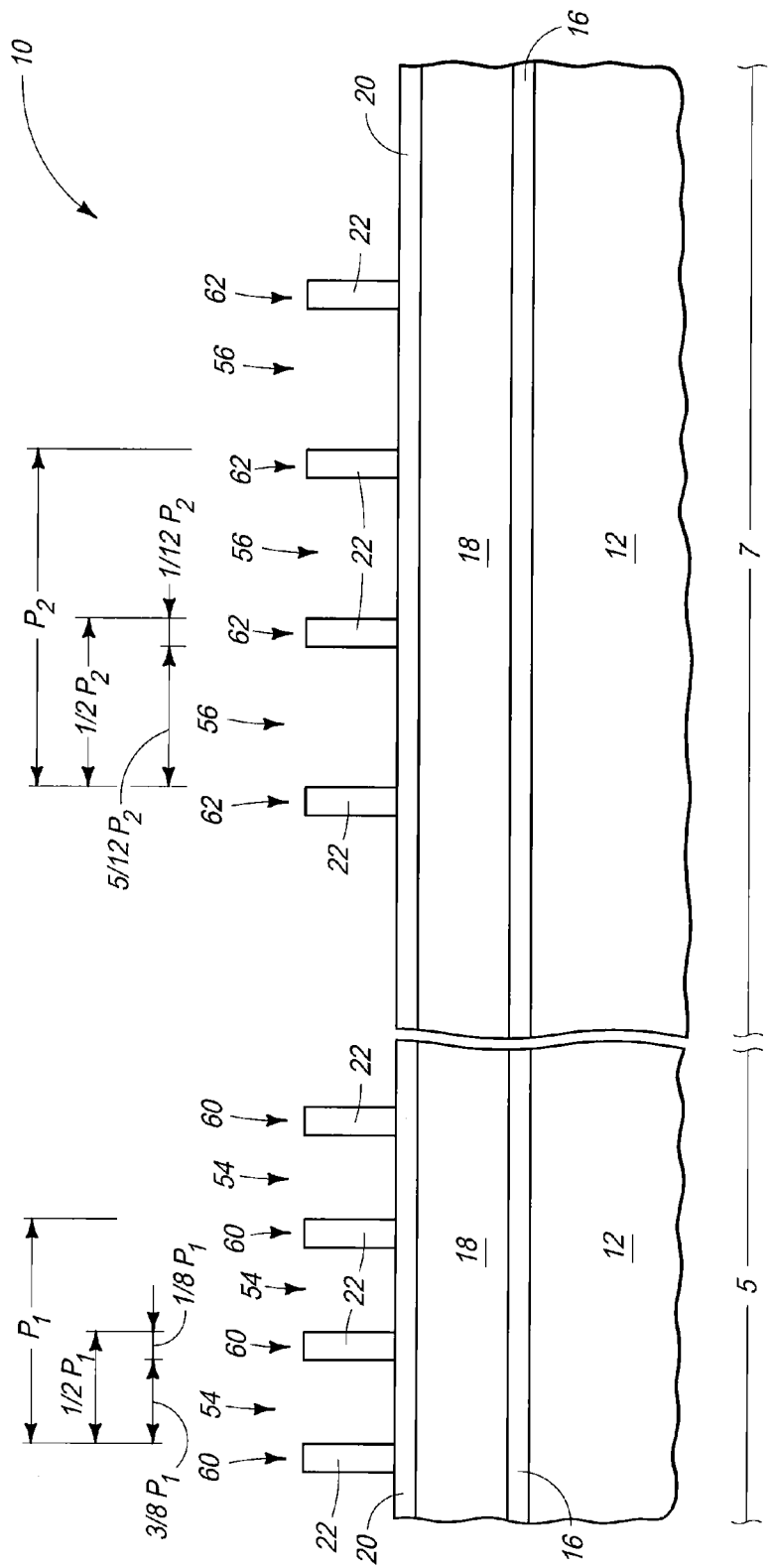

Referring to FIG. 6 gaps 54 and 56 are extended into stack 14 (FIG. 5), and subsequently materials 24 (FIG. 5) and 44 (FIG. 5) are removed. Accordingly, the pattern of spacers 46 (FIG. 5) is transferred into the underlying material 22 to form a plurality of masking features 60 over region 5 of the semiconductor base; and the pattern of spacers 48 (FIG. 5) is transferred into the underlying material 22 to form a plurality of masking features 62 over region 7 of the semiconductor base.

The features 60 and 62 may be formed with any suitable processing. For instance, in some embodiments material 24 (FIG. 5) comprises silicon oxynitride, and an etch may be utilized to extend gaps 54 and 56 through such silicon oxynitride and to thus pattern the silicon oxynitride into a hard mask. The patterned silicon oxynitride hard mask may then be utilized during a subsequent etch of the material 22 to pattern material 22 into the features 60 and 62. In some embodiments, material 22 may comprise carbon and material 20 may comprise a form of silicon oxynitride, and the etch utilized to pattern material 22 may be selective for carbon relative to the form of silicon oxynitride.

In some embodiments, the patterned masking features 30 and 32 of FIG. 1 may be referred to as first and second masking features, respectively; and the features 60 and 62 of FIG. 6 may be referred to as a third and fourth masking features, respectively. The third masking features 60 may be considered to be formed utilizing the first masking features 30 (FIG. 1) as a template, and similarly the fourth masking features 62 may be considered to be formed utilizing the second masking features 32 (FIG. 1) as a template. In the shown embodiment, the features 60 have a pitch which is about $1/2$ $P_1$, and the features 62 have a pitch which is about $1/2$ $P_2$.

The features 60 and 62 are described above as being third and fourth masking features, respectively, due to the illustrated process starting at the processing stage of FIG. 1. In other embodiments, a process may be considered to start at the stage of FIG. 6, and in such embodiments the features 60 and 62 may be referred to as first and second masking features, respectively.

Figure 7:
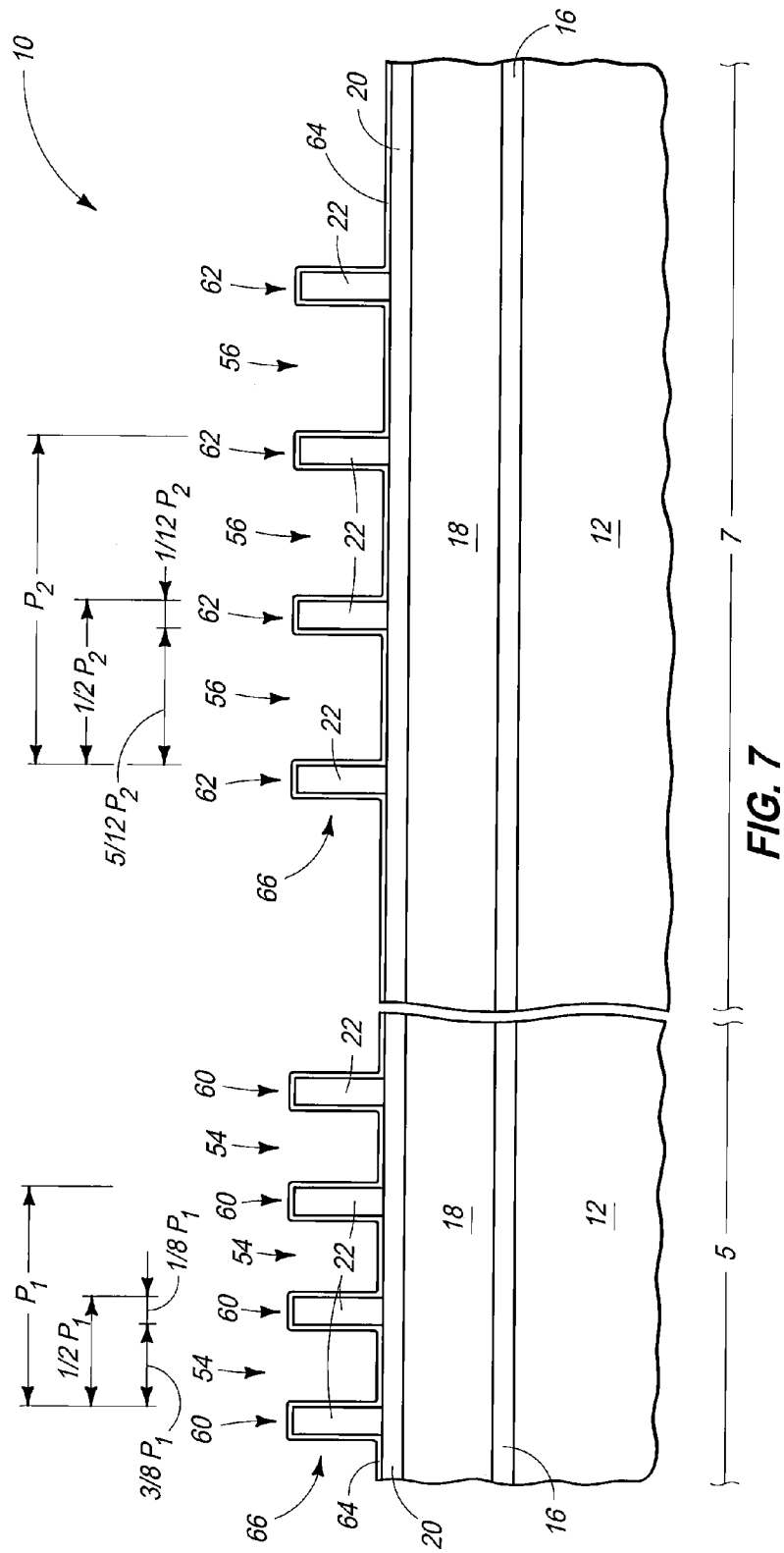

Referring to FIG. 7, liner material 64 is formed over and between the features 60 and 62 to create a liner 66 that extends along and between such features. The liner material 64 may comprise any suitable composition or combination of compositions that may be formed conformally across the features; and in some embodiments may comprise, consist essentially of, or consist of silicon dioxide, silicon (amorphous and/or polycrystalline), silicon oxynitride or silicon nitride. If the liner comprises silicon dioxide, such may be high-density silicon oxide. An advantage of utilizing silicon dioxide for the liner material 64 is that such may be formed at relatively low temperatures as compared to some other materials.

The liner 66 may comprise any suitable thickness, and in some embodiments will have a thickness within a range of from about 5 angstroms to about 100 angstroms; such as, for example, a thickness of about 50 angstroms.

In some embodiments, the liner may be formed utilizing ALD of silicon dioxide, silicon, silicon oxynitride or silicon nitride. In some embodiments, the liner material may be treated to increase density of the liner material, which may make the liner a more effective blocking layer. The densification of the liner material may also decrease a thickness of the liner. Example treatments may include one or both of helium treatment and thermal treatment. Additionally, or alternatively, liner material may be treated with a plasma. For instance, nitrogen-containing liner material may be treated with a nitrogen-containing plasma to increase nitrogen content within the liner material and to thereby render the liner material more resistant to various etches. As another example, liner material may be treated with a $N_2O$-containing plasma to densify the liner material.

Figure 8:
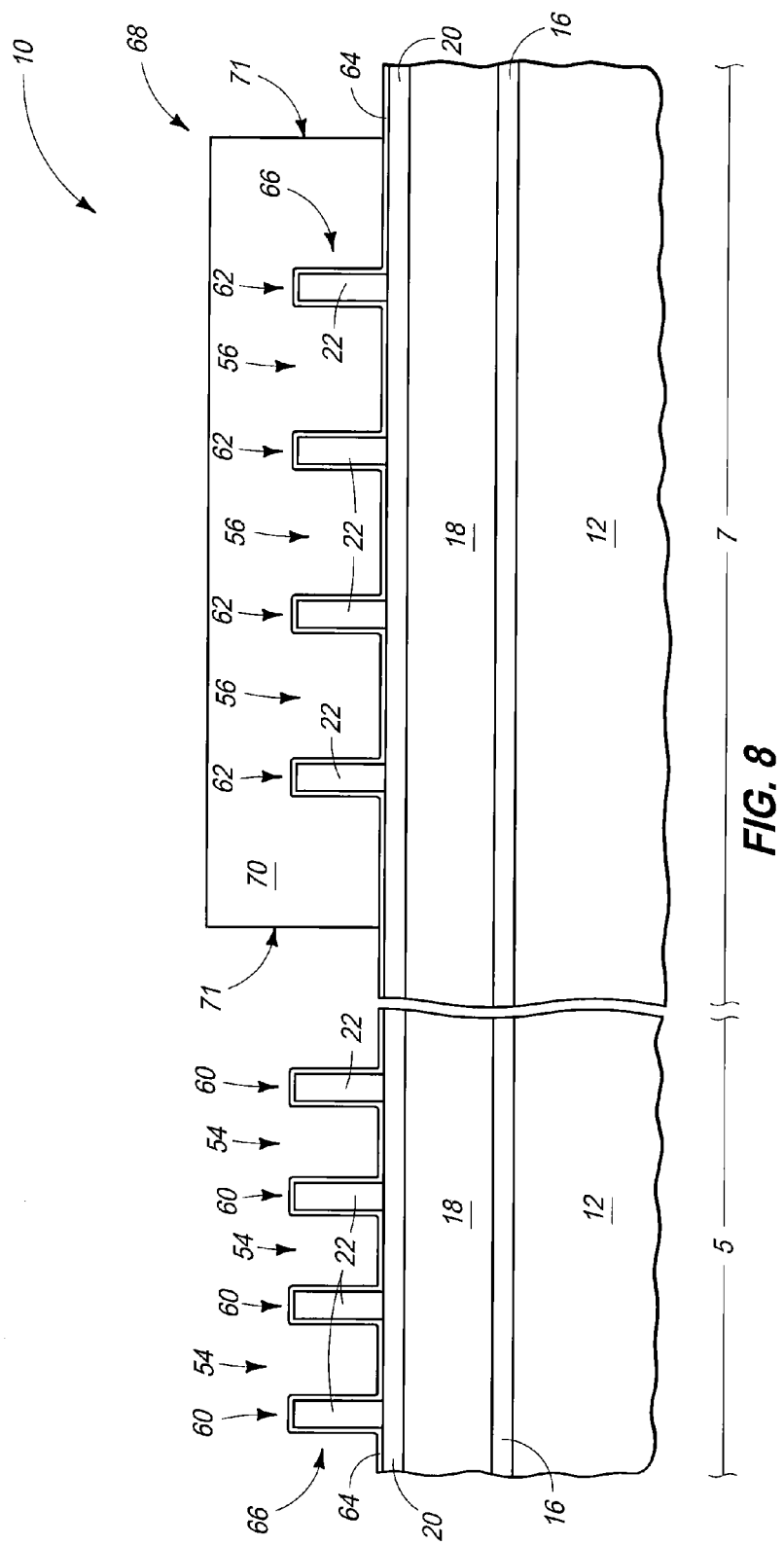

Referring to FIG. 8, a protective mask 68 is formed over the lined features 62, while leaving the lined features 60 exposed. The protective mask 68 comprises a patterned masking material 70. In some embodiments, such patterned masking material may correspond to photolithographically-patterned photoresist.

The protective mask 68 has lateral edges 71. Although the mask appears to have two lateral edges in the side view of FIG. 8, the mask may have a continuous lateral periphery when viewed from above the construction; and thus the lateral edges 71 may be part of a continuous lateral periphery of the protective mask.

Figure 9:
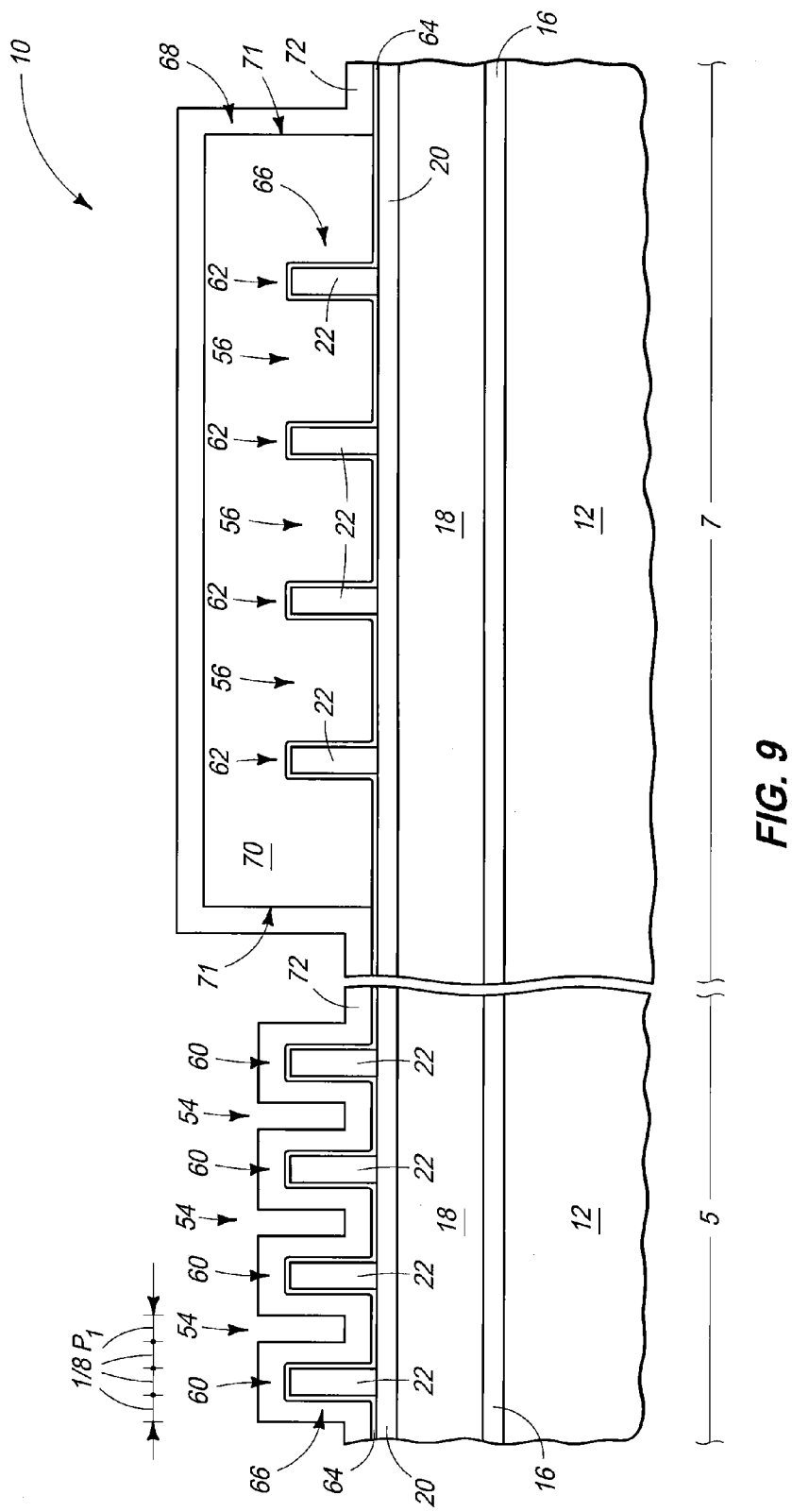

Referring to FIG. 9, spacer material 72 is formed over and between the features 60, and over the protective mask 68. In the shown embodiment, the liner 66 remains along features 60 during deposition of the spacer material 72. In other embodiments, the liner 66 may be removed prior to deposition of the spacer material.

The spacer material 72 may comprise any suitable composition or combination of compositions, and in some embodiments may comprise, consist essentially of, or consist of silicon oxide. Such spacer material may be formed with any suitable processing, including, for example, one or both of ALD and CVD.

The spacer material 72 may be formed to any suitable thickness; and in some embodiments may be formed to a thickness within a range of from about 50 angstroms to about 300 angstroms. In the shown embodiment, the combined thickness of the spacer material 72 and the liner material 64 is ⅛ $P_1$. In other embodiments (not shown) in which the liner material 64 is removed prior to deposition of spacer material 72, the spacer material 72 may itself have a thickness of about ⅛ $P_1$. If the liner material 64 is removed prior to deposition of the spacer material 72, such removal may be accomplished with a wet etch. Alternatively, the liner material may be subjected to an anisotropic etch (dry etch) to pattern the liner material into spacers along the sidewalls of features 22 prior to deposition of spacer material 72. Such may improve selectivity of a subsequent anisotropic etch of the spacer material 72 by exposing material 20.

Figure 10:
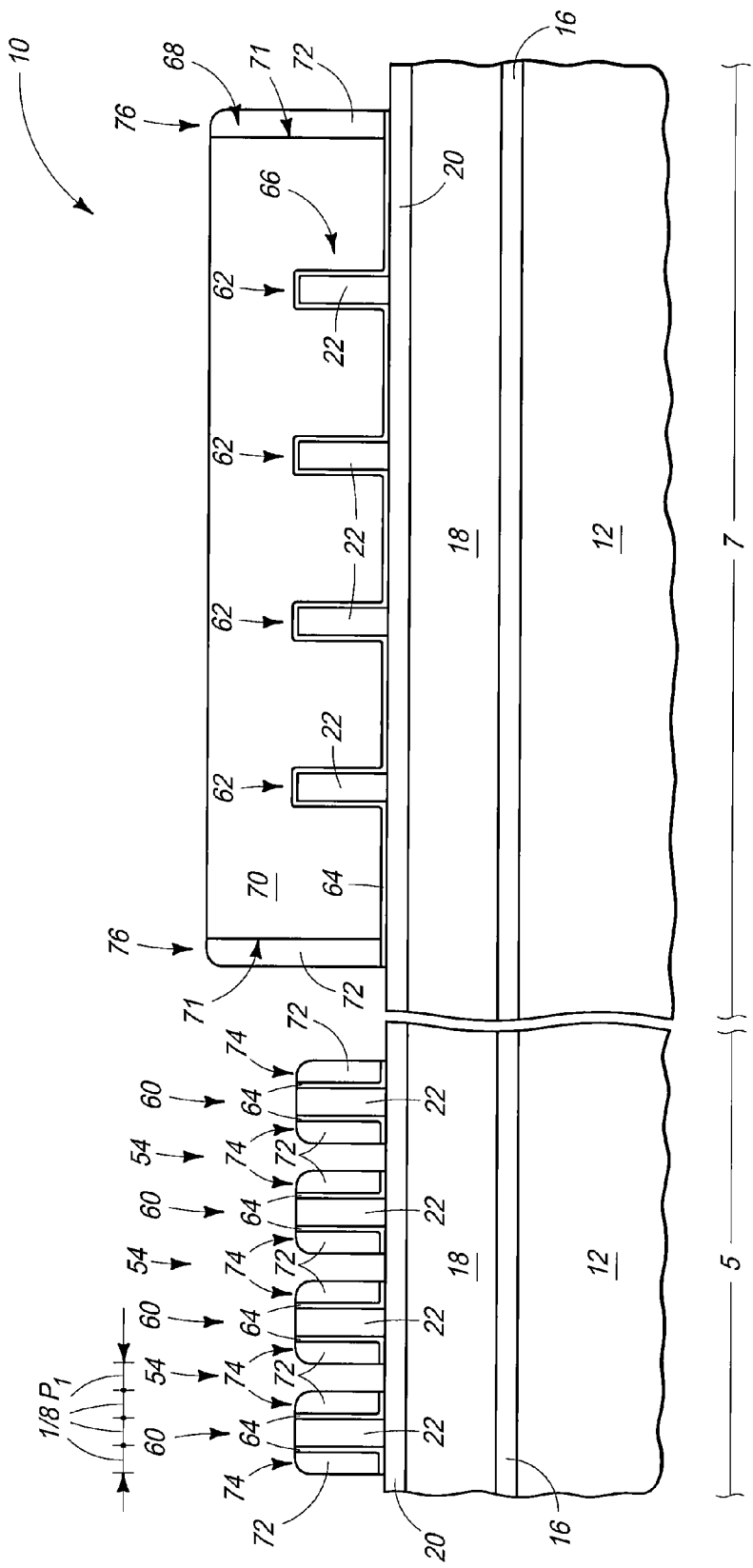

Referring to FIG. 10, an anisotropic etch of spacer material 72 is utilized to form spacers 74 along the features 60. In the shown embodiment, the liner material 64 is incorporated into the spacers 74 together with the spacer material 72. In some embodiments, the spacer material 72 may comprise silicon dioxide and the liner material 64 may comprise silicon nitride; and the formation of the spacers 74 may comprise a fluorine-containing etch to anisotropically etch material 72, followed by a dry etch of the exposed regions of the silicon nitride liner.

In some embodiments, the liner material 64 may be compositionally different from the spacer material 72 (for instance, the liner material may consist of silicon nitride and the spacer material may consist of silicon dioxide), and in other embodiments the liner material and the spacer material may both be a same composition as one another (for instance, both may consist of silicon dioxide).

As discussed above with reference to FIG. 9, some embodiments (not shown) may comprise removal of liner material 64 prior to formation of spacer material 72. In such embodiments, the spacers 74 will be similar to those of FIG. 10; but will comprise only spacer material 72, rather than comprising segments of the liner material 64 in combination with the spacer material 72.

Figure 10A:
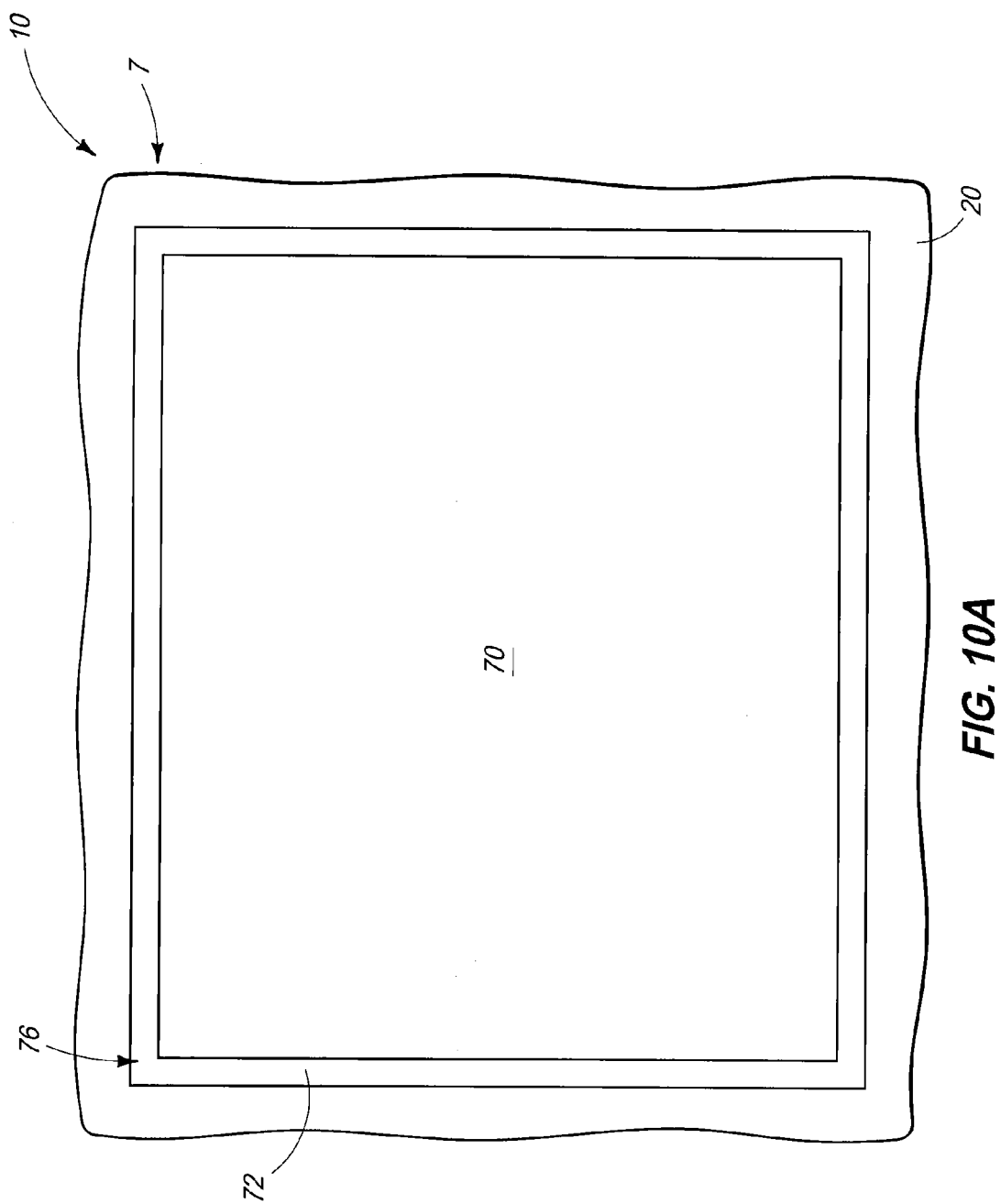

The anisotropic etch of spacer material 72 also forms spacers 76 along the lateral edges 71 of the protective mask 68. Although there appear to be two spacers 76 in the side view of FIG. 10, the illustrated spacers 76 may be part of single continuous spacer that extends along a continuous lateral periphery of the protective mask 68. For instance, FIG. 10A shows a plan view of region 7 in an embodiment in which the spacer material 72 forms a spacer 76 that configured as a fence extending entirely around a periphery of masking material 70. The illustrated periphery is rectangular, but in other embodiments the periphery may have a different configuration.

The configuration of FIG. 10A shows the spacer 76 fence surrounding a portion of the peripheral region 7. In other configurations, such fence may surround a portion which overlaps the memory region 5 (FIG. 10) and the peripheral region 7. In yet other configurations, such fence may surround a portion of the memory region 5 instead of surrounding a portion of the peripheral region 7.

The configuration of FIG. 10 shows four features 62 between the opposing spacers 76. Such is for diagrammatic purposes only, and there may be more or less than the illustrated number of features between the opposing spacers. In some embodiments, there may be many more than four features 62 between such opposing spacers.

In some embodiments, the spacers 74 and 76 of FIG. 10 may be referred to as first and second spacers, respectively.

Figure 11:
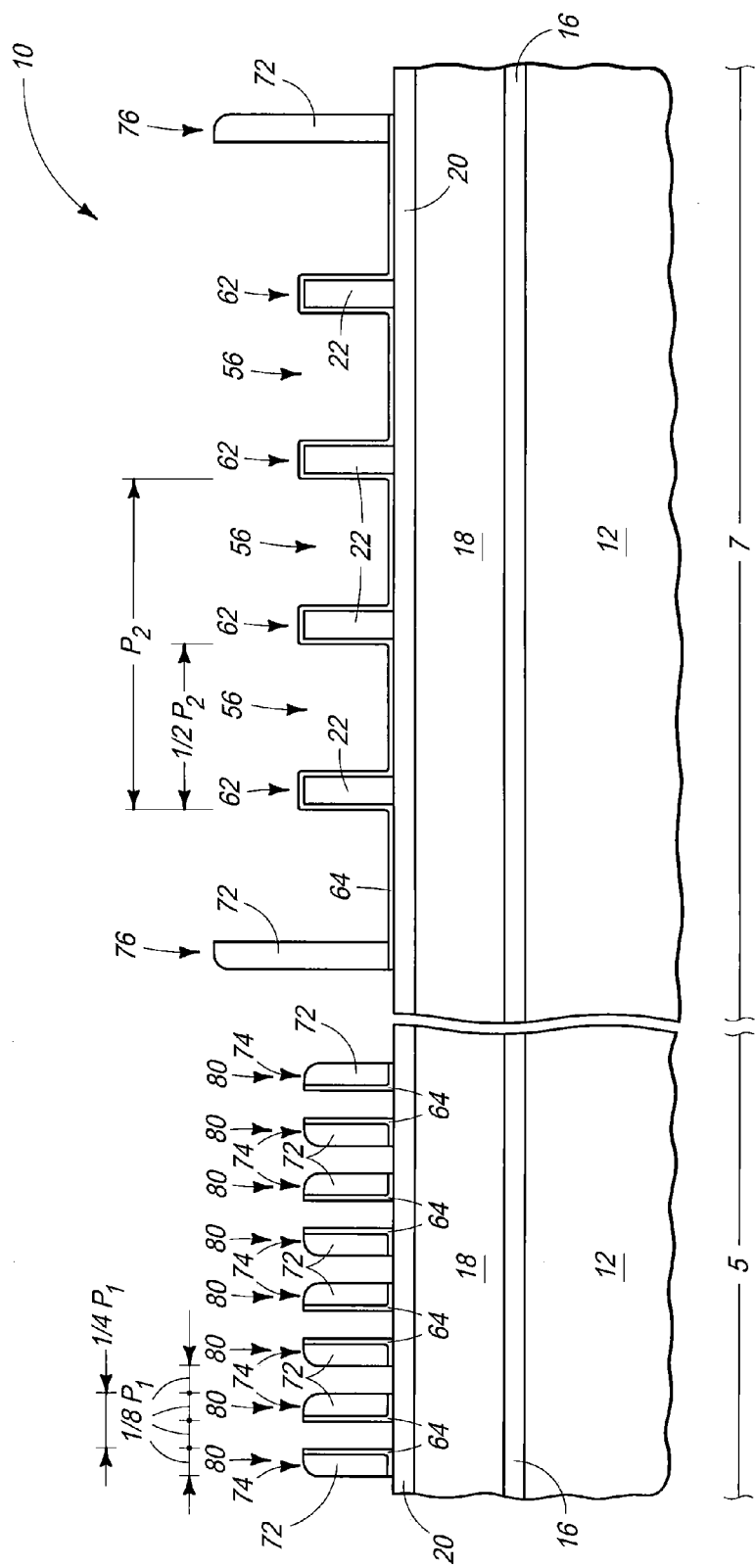

Referring to FIG. 11, the protective mask 68 (FIG. 10) is removed together with the first features 60 (FIG. 10). In some embodiments, the first features 60 may comprise carbon and the protective mask 68 may be an organic material (for instance, photoresist), and the features 60 and protective mask 68 may be removed with a carbon strip. Such carbon strip may comprise any suitable processing, such as, for example, one or both of ashing (which may utilize a temperature of less than about 200° C. in some embodiments) and a wet etch (which may utilize acid and hydrogen peroxide in some embodiments). The liner material 64 functions as a protective block to protect features 62 from being removed during the strip of the protective mask 68.

The spacers 74 remaining at the processing stage of FIG. 11 may be considered to be masking features 80 that are on a pitch of about ¼ $P_1$ (i.e., are on a pitch tighter than the pitch of the masking features 60 that had been used as a template for the masking features 80).

The illustrated masking features 80 comprise spacer material 72 and liner material 64. In other embodiments (not shown) the masking features 80 may comprise only the spacer material 72 (for instance, the liner material may be removed prior to formation of spacer material 72, as discussed above with reference to FIG. 9).

In some embodiments, the masking features 60 and 62 of FIG. 10 may be referred to as first and second masking features, respectively; and the masking features 80 may be referred to as third masking features. In other embodiments, the masking features 30 and 32 of FIG. 1 be referred to as first and second masking features, respectively; the masking features 60 and 62 of FIG. 10 and may be referred to as third and fourth masking features, respectively; and the masking features 80 may be referred to as fifth masking features.

Figure 12:
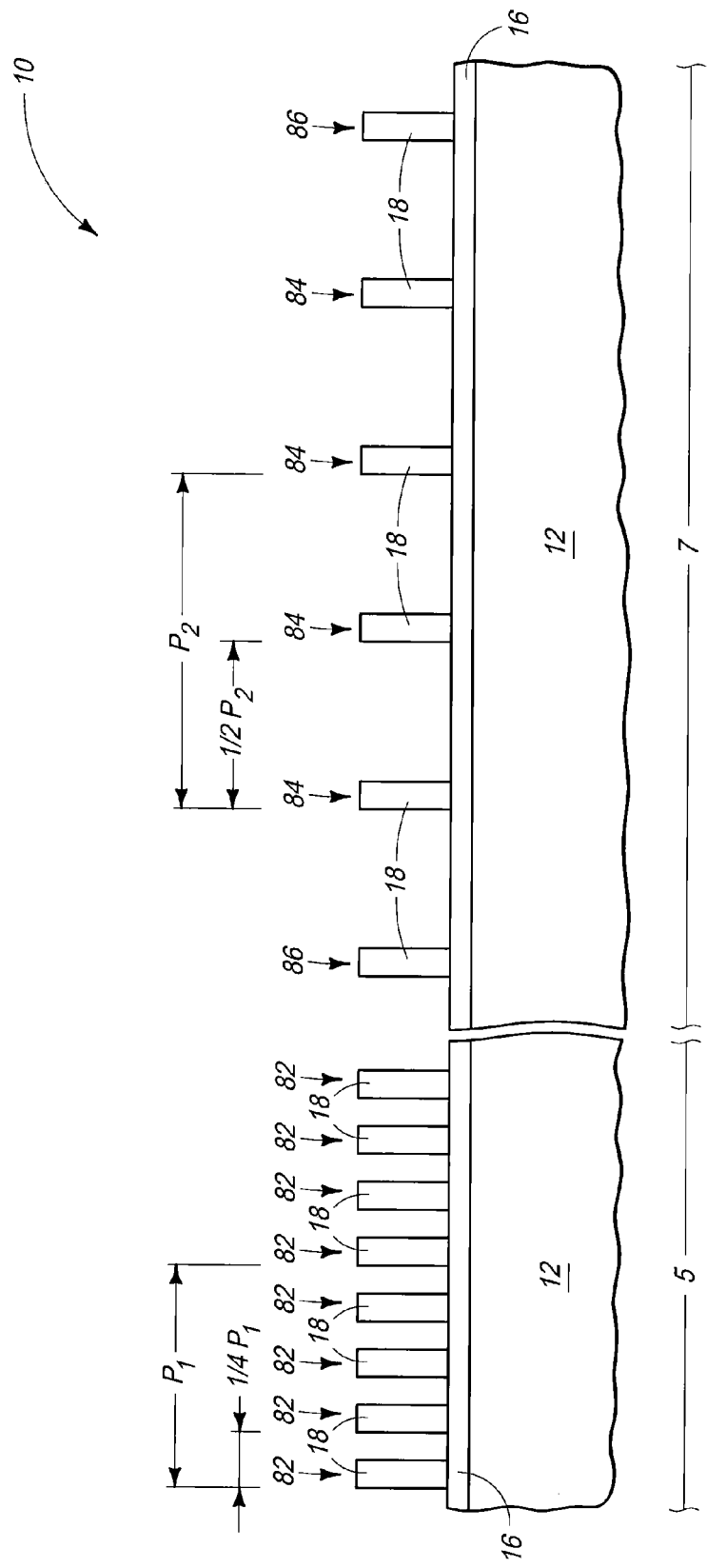

Referring to FIG. 12, the pattern of features 80 (FIG. 11) is transferred into the underlying material 18 to form a plurality of masking features 82 over region 5 of the semiconductor base; and the pattern of features 62 (FIG. 11) is transferred into the underlying material 18 to form a plurality of masking features 84 over region 7 of the semiconductor base. Also, the pattern of second spacers 76 (FIG. 11) is transferred into the underlying material 18 to form masking features 86. Although there appear to be two masking features 86 in the side view of FIG. 10, the illustrated masking features 86 may be part of single continuous masking feature that forms a fence around a portion of region 7.

The features 82, 84 and 86 may be formed with any suitable processing. For instance, in some embodiments material 20 (FIG. 11) comprises silicon oxynitride, and an etch may be utilized to pattern the silicon oxynitride into a hard mask. Such patterned hard mask may be utilized during subsequent etching of material 18 to pattern material 18 into the features 82, 84 and 86. In some embodiments, material 18 may comprise carbon and material 16 may comprise silicon nitride, and the etch utilized to pattern material 18 may be selective for carbon relative to silicon nitride.

The masking features 82 have a pitch which is about ¼ $P_1$, and the masking features 84 have a pitch which is about ½ $P_2$.

Figure 13:
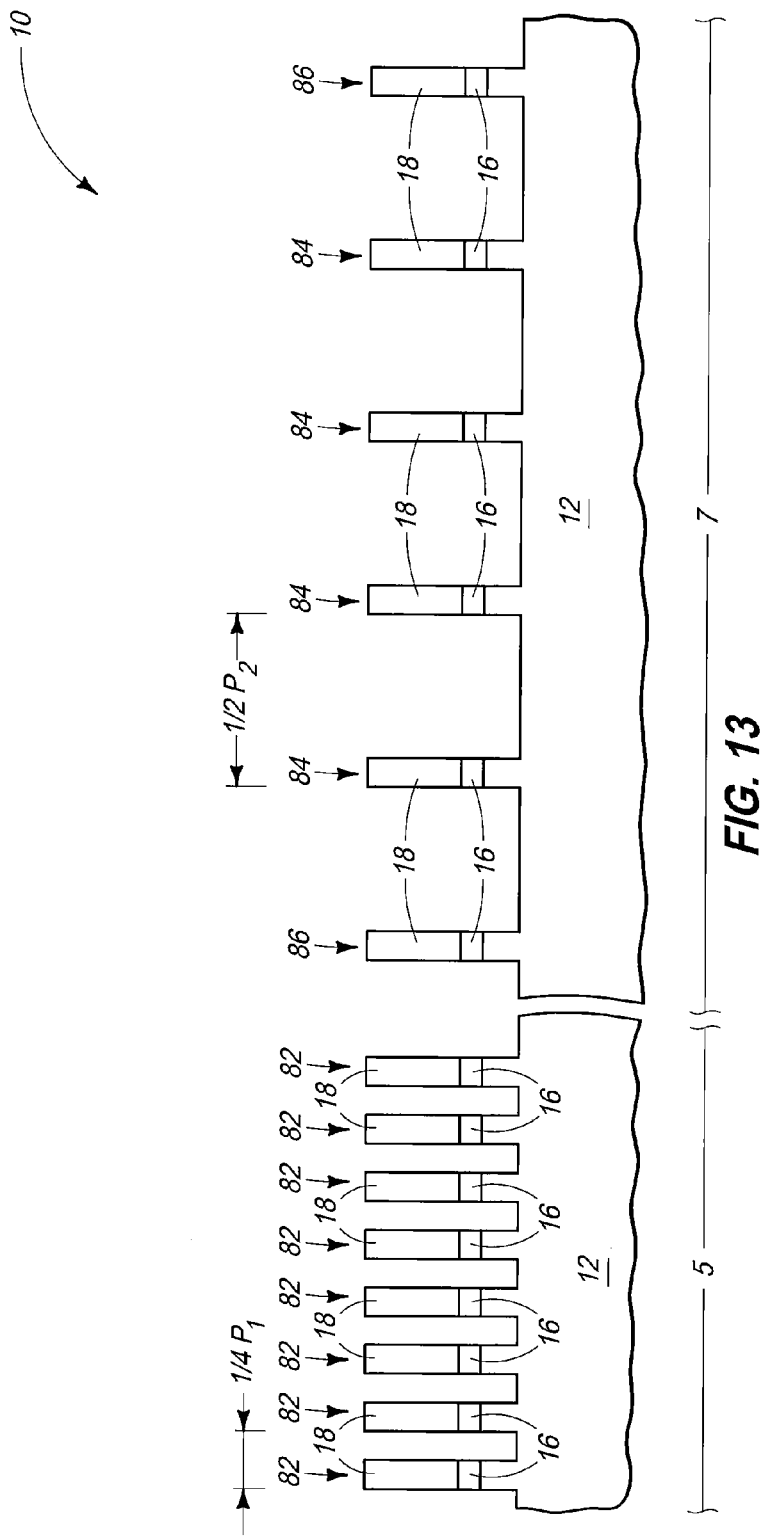

Referring to FIG. 13, the masking features 82, 84 and 86 are utilized to pattern the silicon nitride material 16 and the semiconductor base 12. In the shown embodiment, the masking features 82, 84 and 86 remain over patterned material 16 and patterned semiconductor base 12. In other embodiments, the masking features may be utilized to pattern the silicon nitride material into a hard mask, and then may be removed while such hard mask is utilized to pattern the underlying semiconductor base 12.

The embodiment of FIG. 13 shows base 12 as a homogeneous structure. However, as discussed above with reference to FIG. 1, the semiconductor base may comprise numerous materials associated with integrated circuit fabrication; including, for example, various conductive materials, semiconductor materials and insulative materials. The pattern formed into the semiconductor base may extend into one or more materials of the base to pattern such materials. For instance, the pattern formed across region 5 may be utilized to pattern one or more materials for fabrication of memory array circuitry (such as, for example, DRAM circuitry, NAND circuitry, etc.), and the pattern formed across region 7 by masking features 84 may be utilized to pattern one or more materials for fabrication of control circuitry and/or routing circuitry.

Figure 14:
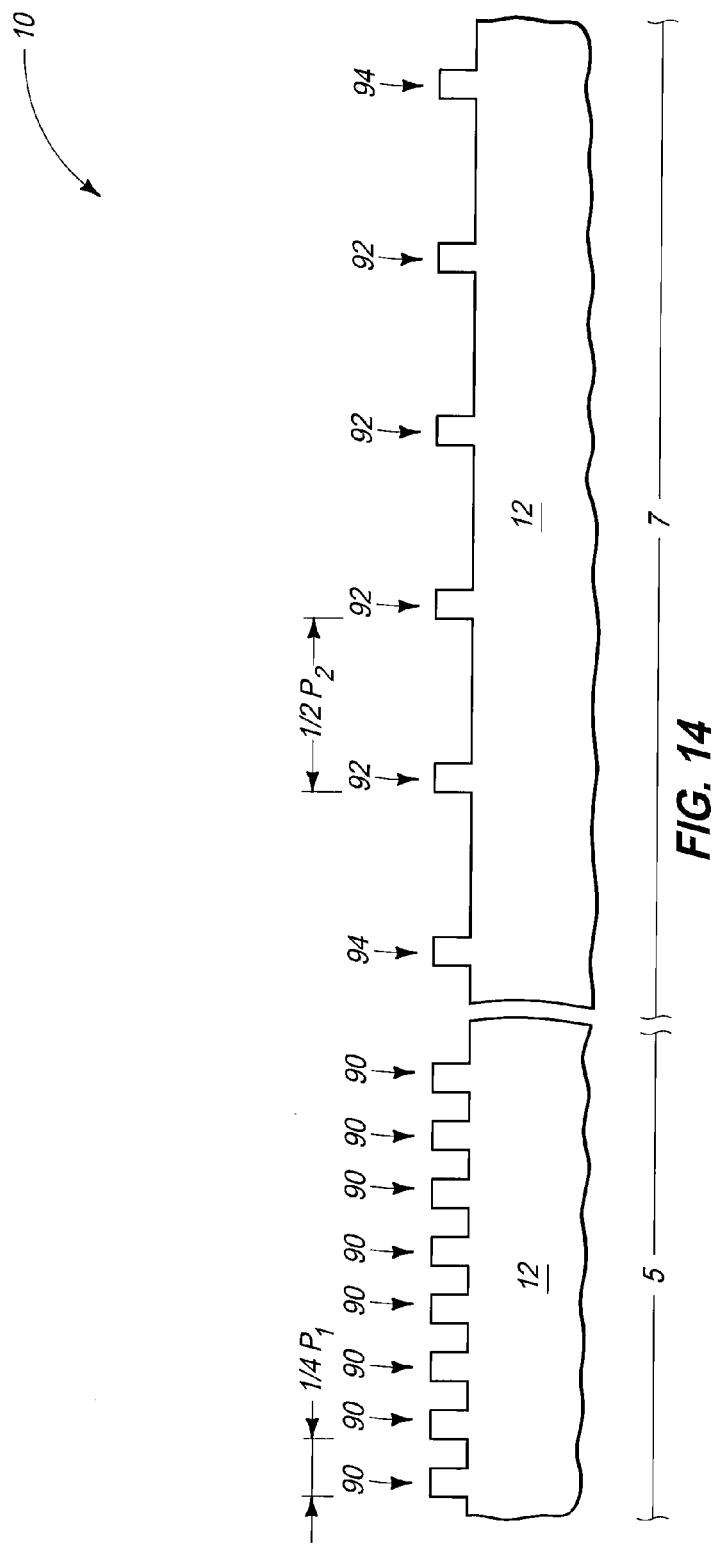

Referring to FIG. 14, materials 16 and 18 (FIG. 13) are removed to leave the patterned semiconductor base 12. The patterned base has features 90 over region 5 formed to a pitch of ¼ $P_1$, and has features 92 over region 7 formed to a pitch of ½ $P_2$. Thus, the methodology of FIGS. 1-14 may be utilized to fabricate components having a relatively tight pitch across one region of a semiconductor base, while also fabricating components having a relatively loose pitch across another region of the semiconductor base.

The patterned semiconductor base 12 also has features 94 generated from the masking features 86 (FIG. 13), and corresponding to locations where the spacers 76 (FIG. 10) are formed alongside the lateral edges of the protective mask 68 (FIG. 10). The features 94 may be a pair of separate features (as shown) or may be part of a continuous fence around an area of base 12. For instance, FIG. 14A shows a plan view of region 7 in an embodiment in which the features 94 are configured as a fence extending entirely around an area within peripheral region 7. The area surrounded by such fence may be referred to as a fenced-in area. The features 92 are not shown in FIG. 14A in order to simplify the drawing. Such features 92 may have any suitable configuration, and in some embodiments may correspond to routing structures that extend across the fenced-in area. Such routing structures may be electrically conductive interconnects utilized to couple memory cells formed in the memory region 5 with logic circuitry, or other circuitry, formed in the peripheral region 7 outside of the fenced-in area. The routing structures may extend across the fenced-in area, and under the fence 94 to electrically couple with other circuitry outside of the fenced-in area.

The fence 94 may comprise any materials of base 12, and in some embodiments may comprise electrically insulative material; such as, for example, silicon dioxide or silicon nitride. In some embodiments, the patterned features 92 comprise one or more patterned materials of base 12, and the fence 94 comprises identical patterned materials as the patterned features. In other words, the materials of the patterned features 92 extend to the locations where the fence 94 is formed and are incorporated into such fence. In other embodiments, the patterned features 92 comprise one or more patterned materials of base 12 that are not in the fence 94 and/or the fence comprises one or more materials that are not in the patterned features. In other words, one or more materials of the patterned features 92 do not extend to the locations where the fence 94 is formed and/or one or more materials incorporated into the fence 94 do not extend across locations where the patterned features 92 are formed.

In the shown embodiment of FIGS. 14 and 14A, the fence 94 is associated with region 7 of the base, but it is to be understood that the fence 94 may be associated with other regions of the base depending on the configuration of the protective mask 68 (FIG. 10). The fence 94 may correspond to a patterned component of an integrated circuit in some embodiments, or may correspond to a vestigial structure that results from tag-along patterning associated with the spacers 76 (FIG. 11) through the process stages of FIGS. 12-14.

FIGS. 13 and 14 illustrate an embodiment in which masking feature patterns are transferred into one or more materials of an underlying semiconductor base by utilizing the masking features to pattern an etch. In other embodiments, masking feature patterns may be transferred into one or more materials of an underlying semiconductor base by utilizing the masking features to pattern a dopant implant into the underlying semiconductor base.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some example methods may include formation of first and second masking features over first and second regions of a semiconductor base, respectively. A liner may be formed to be along and between the first and second masking features. A protective mask may be formed over the lined second masking features, while leaving the first masking features exposed. The protective mask may have lateral edges. First spacers may be formed along sidewall edges of the first masking features, and second spacers may be formed along the lateral edges of the protective mask. The protective mask and the first masking features may be removed, while leaving the lined second masking features remaining over the second region, while leaving the first spacers remaining over the first region, and while leaving the second spacers remaining over the semiconductor base. The first spacers may be third masking features that are at a tighter pitch than the first masking features. Patterns of the second masking features and the third masking features may be transferred into one or more materials of the semiconductor base to pattern said one or more materials.

Some example methods may include formation of a patterned mask over a semiconductor base. The patterned mask may comprise first masking features over a first region of the semiconductor base, and may comprise second masking features over a second region of the semiconductor base. The first masking features may be at a first pitch and the second masking features may be at a second pitch, with the first pitch being tighter than the second pitch. The first and second masking features may be used as templates for third and fourth masking features, respectively, that are formed into a stack over the semiconductor base. The third masking features may be at a third pitch which is about one-half of the first pitch, and the fourth masking features may be at a fourth pitch which is about one-half of the second pitch. A liner may be formed to be along and between the third and fourth masking features. A protective mask may be formed over the fourth masking features, while leaving the third masking features exposed. The protective mask may have lateral edges. First spacers may be formed along sidewall edges of the third masking features, and second spacers may be formed along the lateral edges of the protective mask. The protective mask and the third masking features may be removed while leaving the lined fourth masking features remaining over the second region, while leaving the first spacers remaining over the first region, and while leaving the second spacers remaining over the semiconductor base. The first spacers may be at least part of fifth masking features which are at a fifth pitch that is about one-fourth of the first pitch. Patterns of the fourth masking features and of the fifth masking features may be transferred into one or more materials of the semiconductor base to pattern said one or more materials.

Some example methods may include formation of first and second masking features over first and second regions of a semiconductor base, respectively. The first masking features may be at a first pitch, and the second masking features being at a second pitch which is different from the first pitch. A liner may be formed to be along and between the first masking features, and along and between the second masking features. A protective mask may be formed over the lined second masking features, while leaving the lined first masking features exposed. The protective mask may have lateral edges. Spacer material may be formed along sidewall edges of the lined first masking features, and along the lateral edges of the protective mask. The spacer material may be anisotropically etched to form first spacers along the sidewall edges of the first masking features, and to form second spacers along the lateral edges of the protective mask. The first spacers may comprise the spacer material and the liner material, with the spacer material being compositionally different from the liner material. The protective mask and the first masking features may be removed while leaving the lined second masking features remaining over the second region, while leaving the first spacers remaining over the first region, and while leaving the second spacers remaining over the semiconductor base. The first spacers may be considered third masking features that are at a tighter pitch than the first pitch. Patterns of the second masking features and the third masking features may be transferred into one or more materials of the semiconductor base to pattern said one or more materials.

Some example embodiments may include a patterned semiconductor base that has a fence around an area of the base, with the area of the base surrounded by the fence being a fenced-in area. The patterned semiconductor base may have a plurality of patterned features within the fenced-in area.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of patterning multiple regions of a semiconductor base, comprising:
   forming first masking features over a first of the regions, and forming second masking features over a second of the regions;
   forming a liner along and between the first and second masking features;

forming a protective mask over the lined second masking features, while leaving the first masking features exposed; the protective mask having lateral edges;

forming first spacers along sidewall edges of the first masking features, and forming second spacers along the lateral edges of the protective mask;

removing the protective mask and the first masking features while leaving the lined second masking features remaining over the second region, while leaving the first spacers remaining over the first region, and while leaving the second spacers remaining over the semiconductor base; the first spacers being third masking features that are at a tighter pitch than the first masking features; and transferring patterns of the second masking features and the third masking features into one or more materials of the semiconductor base to pattern said one or more materials.

2. The method of claim 1 wherein the third masking features comprise segments of the liner.

3. The method of claim 1 wherein the third masking features do not comprise segments of the liner.

4. The method of claim 1 wherein the first masking features are at a different pitch than the second masking features.

5. The method of claim 1 wherein the first masking features are at a tighter pitch than the second masking features.

6. The method of claim 1 wherein the first and second masking features comprise patterned carbon.

7. The method of claim 1 wherein the pattern of the second spacers is also transferred into one or more materials of the semiconductor base.

8. A semiconductor base patterned by the method of claim 7.

9. A method of patterning multiple regions of a semiconductor base, comprising:

forming first masking features over a first of the regions, and forming second masking features over a second of the regions;

atomic layer depositing a liner along and between the first and second masking features, the liner comprising silicon dioxide, silicon, silicon nitride or silicon oxynitride;

forming a protective mask over the lined second masking features, while leaving the first masking features exposed; the protective mask having lateral edges;

forming first spacers along sidewall edges of the first masking features, and forming second spacers along the lateral edges of the protective mask, the first and second spacers comprising silicon dioxide;

removing the protective mask and the first masking features while leaving the lined second masking features remaining over the second region, while leaving the first spacers remaining over the first region, and while leaving the second spacers remaining over the semiconductor base; the first spacers being third masking features that are at a tighter pitch than the first masking features; and transferring patterns of the second masking features and the third masking features into one or more materials of the semiconductor base to pattern said one or more materials.

10. The method of claim 9 wherein the liner consists of silicon dioxide.

11. The method of claim 9 wherein the liner consists of silicon.

12. The method of claim 9 wherein the liner consists of silicon nitride.

13. The method of claim 9 wherein the liner consists of silicon oxynitride.

14. A method of patterning multiple regions of a semiconductor base, comprising:

forming a patterned mask over said regions; the patterned mask comprising first masking features over a first of the regions, and comprising second masking features over a second of the regions; the first masking features being at a first pitch and the second masking features being at a second pitch; the first pitch being tighter than the second pitch;

using the first and second masking features as templates for third and fourth masking features, respectively, that are formed into a stack over the semiconductor base; the third masking features being at a third pitch which is about one-half of the first pitch, and the fourth masking features being at a fourth pitch which is about one-half of the second pitch;

forming a liner along and between the third and fourth masking features;

forming a protective mask over the fourth masking features, while leaving the third masking features exposed; the protective mask having lateral edges;

forming first spacers along sidewall edges of the third masking features, and forming second spacers along the lateral edges of the protective mask;

removing the protective mask and the third masking features while leaving the lined fourth masking features remaining over the second region, while leaving the first spacers remaining over the first region, and while leaving the second spacers remaining over the semiconductor base; the first spacers being at least part of fifth masking features which are at a fifth pitch that is about one-fourth of the first pitch; and transferring patterns of the fourth masking features and of the fifth masking features into one or more materials of the semiconductor base to pattern said one or more materials.

15. The method of claim 14 wherein the pattern of the second spacers is also transferred into one or more materials of the semiconductor base.

16. A semiconductor base patterned by the method of claim 15.

17. The method of claim 14 wherein the patterned mask comprises photolithographically patterned photoresist.

18. The method of claim 17 further comprising a lateral trim of the first and second masking features prior to using the first and second masking features as templates for the third and fourth masking features.

19. The method of claim 14 wherein the third and fourth masking features comprise carbon.

20. The method of claim 14 wherein the protective mask comprises photolithographically patterned photoresist.

21. The method of claim 14 further comprising removing the liner from along sidewalls of the third masking features prior to forming the first spacers.

22. The method of claim 14 wherein the first spacers are formed against the liner that is along the sidewalls of the third masking features.

23. The method of claim 14 wherein the fifth masking features only comprise the first spacers.

24. The method of claim 14 wherein the fifth masking features comprise the first spacers in combination with segments of the liner.

25. The method of claim 14 wherein the first and second spacers comprise silicon dioxide.

26. The method of claim 14 wherein the liner comprises silicon dioxide or silicon nitride.

27. A method of patterning multiple regions of a semiconductor base, comprising:
- forming first masking features over a first of the two regions, and forming second masking features over a second of the two regions; the first masking features being at a first pitch and the second masking features being at a second pitch which is different from the first pitch;
- forming a liner along and between the first masking features, and along and between the second masking features; the liner comprising a liner material;
- forming a protective mask over the lined second masking features, while leaving the lined first masking features exposed; the protective mask having lateral edges;
- forming spacer material along sidewall edges of the lined first masking features, and along the lateral edges of the protective mask;
- anisotropically etching the spacer material to form first spacers along the sidewall edges of the first masking features, and to form second spacers along the lateral edges of the protective mask; the first spacers comprising the spacer material and the liner material; the spacer material being compositionally different from the liner material;
- removing the protective mask and the first masking features while leaving the lined second masking features remaining over the second region, while leaving the first spacers remaining over the first region, and while leaving the second spacers remaining over the semiconductor base; the first spacers being third masking features that are at a tighter pitch than the first pitch; and
- transferring patterns of the second masking features and the third masking features into one or more materials of the semiconductor base to pattern said one or more materials.

28. The method of claim 27 wherein the liner material comprises silicon nitride and the spacer material comprises silicon dioxide.

29. The method of claim 27 wherein the pattern of the second spacers is also transferred into one or more materials of the semiconductor base.

30. A semiconductor base patterned by the method of claim 29.

* * * * *